United States Patent [19]

Guyot

[11] Patent Number: 5,777,513

[45] Date of Patent: Jul. 7, 1998

[54] VOLTAGE AMPLIFIER HAVING A LARGE RANGE OF VARIATIONS, AND A/D CONVERTER COMPRISING SUCH AN AMPLIFIER

[75] Inventor: Benoît Guyot, Caen, France

[73] Assignee: U.S. Philips Corporation, New York, N.Y.

[21] Appl. No.: 755,685

[22] Filed: Nov. 25, 1996

[30]     Foreign Application Priority Data

Nov. 29, 1995 [FR]  France .................... 95 14130

[51] Int. Cl.⁶ ........................ H03F 3/45; H03M 1/36
[52] U.S. Cl. .................................. 330/252; 341/159
[58] Field of Search ............... 330/69, 252; 341/158, 341/159, 161

[56]             References Cited

U.S. PATENT DOCUMENTS 4,904,952  2/1990  Tanimoto ...................... 330/252

5,345,237  9/1994  Kouno et al. .................. 341/158 X

*Primary Examiner*—James B. Mullins
*Attorney, Agent, or Firm*—Steven R. Biren

[57]                ABSTRACT

A voltage amplifier AD comprising two transistors (Q1, Q2) arranged as a differential pair, having collectors which are connected to a positive power supply terminal (VCC) by means of two branches each comprising a resistive load. One of the branches comprises at least two resistive elements (R21, R22) arranged in series. The amplifier AD is also provided with a third branch comprising a resistive element (R3) arranged in series with a current source (I3). The amplifier AD is also provided with means for comparing the potentials of the different nodes of the circuit, which means allow addition of a first and a second current (I0, I0') to the current supplied in a portion of the resistive load of the second branch. These currents allow rectification of the non-linearity of the evolution of the output voltage (Vout) as a function of the input voltage (Vin).

20 Claims, 5 Drawing Sheets

VOLTAGE AMPLIFIER HAVING A LARGE RANGE OF VARIATIONS, AND A/D CONVERTER COMPRISING SUCH AN AMPLIFIER

BACKGROUND OF THE INVENTION

The invention relates to a voltage amplifier intend to receive an input voltage and to supply an output voltage, which voltage amplifier comprises an amplifier stage including a first and a second transistor arranged as a differential pair, the base of the first transistor being intended to receive the input voltage, the base of the second transistor being intended to receive a voltage opposed to said input voltage, the collector of the first transistor being connected to a positive power supply terminal by means of a first branch comprising a resistive load, the collector of the second transistor, intended to supply the output voltage, being connected to the positive power supply terminal by means of a second branch comprising a resistive load.

A voltage amplifier of this type is described in U.S. Pat. No. 4,904,952. This known voltage amplifier provides a strong voltage gain, while having a good frequency behaviour. However, it has been found that its transfer characteristic loses linearity in the neighbourhood of the limits of the range of variations of the output voltage. Moreover, as the number of transistor stages is minimally three between the two power supply potentials of the circuit, this range of variations is necessarily reduced, which presents a major drawback in "low-voltage" applications.

SUMMARY OF THE INVENTION

It is an object of the invention to remedy these drawbacks by proposing a voltage amplifier in which the linearity of the transfer characteristic is improved in the neighbourhood of the limits of the range of variations of the output voltage, while using a limited number of transistor stages between the two power supply potentials of the circuit.

According to the invention, a voltage amplifier of the type defined in the opening paragraph is characterized in that the second branch is constituted by at least two series-arranged resistive elements having at least a first intermediate node between the positive power supply terminal and the collector of the second transistor, in that the voltage amplifier is provided with a third branch comprising a resistive element arranged in series with a current source, said third branch being arranged between the positive power supply terminal and a negative power supply terminal and featuring a second intermediate node between the resistive element and the current source, and in that the voltage amplifier is provided with means for comparing the potential of the second intermediate node with that of the collector of the first transistor, on the one hand, and the potential of the second intermediate node with that of the collector of the second transistor, on the other hand, and for adding to the current supplied in a portion of the resistive load of the second branch, a first current which is progressively reduced to zero when the potential of the collector of the first transistor falls below that of the second intermediate node, and a second current which is progressively reduced to zero when the potential of the collector of the second transistor exceeds that of the second intermediate node.

A particularly advantageous embodiment of the invention is a voltage amplifier which is characterized in that the means for comparing the potential of the second intermediate node with that of the collector of the first transistor, on the one hand, and the potential of the second intermediate node with that of the collector of the second transistor, on the other hand, respectively comprise a third and a fourth transistor arranged as a differential pair, and a fifth and a sixth transistor, arranged as a differential pair, the base of the third transistor being connected to the collector of the first transistor and that of the fourth transistor being connected to the second intermediate node, the base of the fifth transistor being connected to the collector of the second transistor and that of the sixth transistor being connected to the second intermediate node, the collectors of the third and the sixth transistor being connected to the first intermediate node.

The additional differential pairs being arranged in parallel with the amplifier stage, the amplifier thus has a limited number of transistor stages between the two power supply terminals of the circuit, while the sum of the voltage drops at the terminals of the various transistors is consequently also limited, which renders the amplifier particularly suitable for "low-voltage" applications.

A variant of the invention allows control of the comparison thresholds without significantly modifying the gain of the amplifier so as to limit the effects of the correction of the output voltage to the sole ranges of variations in which this voltage evolves in a non-linear manner.

Such a voltage amplifier is characterized in that the resistive element between the positive power supply terminal and the first intermediate node and the resistive element comprised in the third branch have substantially the same value, and in that the current supplied by the current source comprised in the third branch has a value substantially equal to the maximum value of the current flowing in the second transistor.

In accordance with another embodiment of the invention, a voltage amplifier is characterized in that the resistive element between the first intermediate node and the positive power supply terminal has a value which is lower than that of the resistive element between the first intermediate node and the collector of the second transistor.

Since the portion of the resistive load in which the current(s) added by the additional differential pairs flow(s), in addition to the normal operating current of the amplifier stage, is limited, the voltage drop caused by the current(s) added by the additional differential pairs is thus limited to a simple corrective effect.

An amplifier according to the invention not only has the advantage of a transfer characteristic with an improved linearity over a larger range of variations of the input voltage but also has the advantage of supplying a single, non-differential output signal which renders it particularly suitable for applications of the A/D conversion type where the output voltage of the amplifier is compared with a range of reference voltages which themselves are also non-differential.

The invention thus also relates to an A/D converter intended to receive an analog input voltage of a differential nature, to be converted into a digital output signal, comprising:

an input amplifier intended to receive the analog input voltage and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages, a memory stage intended to store the results of said comparisons, and a binary encoder intended to receive the information stored in the memory stage and to supply the digital output signal of the converter, characterized in that the input amplifier is an amplifier as described hereinbefore.

These and other aspects of the invention will be apparent from and elucidated with reference to the embodiments described hereinafter.

DESCRIPTION OF THE PREFERRED EMBODIMENTS

Figure 1:
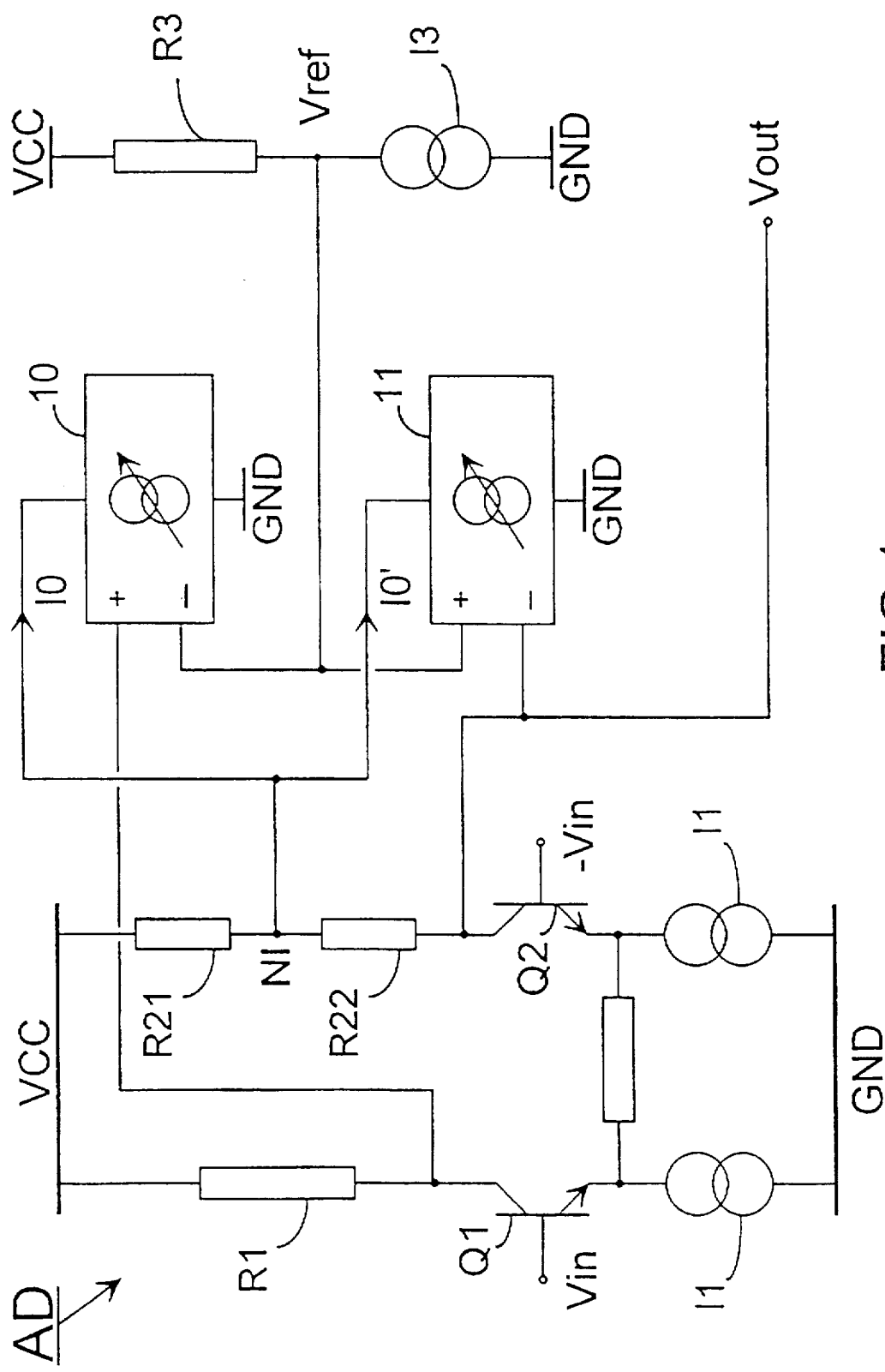
FIG. 1 is a partial functional circuit diagram of a voltage amplifier according to the invention.

FIG. 1 shows diagrammatically a voltage amplifier AD according to the invention. Two transistors Q1 and Q2 are arranged as a differential pair: the emitter of transistor Q1 is connected to one of the terminals of a resistor, while the emitter of transistor Q2 is connected to the other terminal of the same resistor. Each of the two emitters is connected to a terminal of a current source I1, while the other terminal of said current source is connected to a negative power supply terminal, referred to as GND. The base of transistor Q1 receives the input voltage, referred to as Vin, of the voltage amplifier, while the base of the transistor Q2 receives the opposite of said input voltage, referred to as −Vin. The collector of the first transistor Q1 is connected to a positive power supply terminal, referred to as VCC, by means of a first branch comprising a resistive load, while the collector of the second transistor Q2, supplying the output voltage referred to as Vout, is connected to the positive power supply terminal VCC by means of a second branch comprising a resistive load. The first branch is formed by a resistive element R1. The second branch is formed by at least two resistive elements, referred to as R21 and R22, which are arranged in series and have at least a first intermediate node, referred to as NI, between the positive power supply terminal VCC and the collector of the second transistor Q2.

The voltage amplifier AD is provided with a third branch comprising a resistive element R3 arranged in series with a current source I3, which third branch is arranged between the positive power supply terminal VCC and the negative power supply terminal GND and features a second intermediate node between the resistive element R3 and the current source I3. The voltage amplifier is also provided with means 10 and 11 for comparing the potential of the second intermediate node, referred to as Vref, with that of the collector of the first transistor Q1, on the one hand, and the potential of the second intermediate node Vref with that of the collector of the second transistor Q2, on the other hand. The same means allow the addition to the current supplied in a portion of the resistive load of the second branch, of a first current IO which is progressively reduced to zero when the potential of the collector of the first transistor Q1, referred to as VC1, falls below Vref, and of a second current IO' which is progressively reduced to zero when the potential of the collector of the second transistor Q2, referred to as VC2, exceeds Vref.

Figure 2:
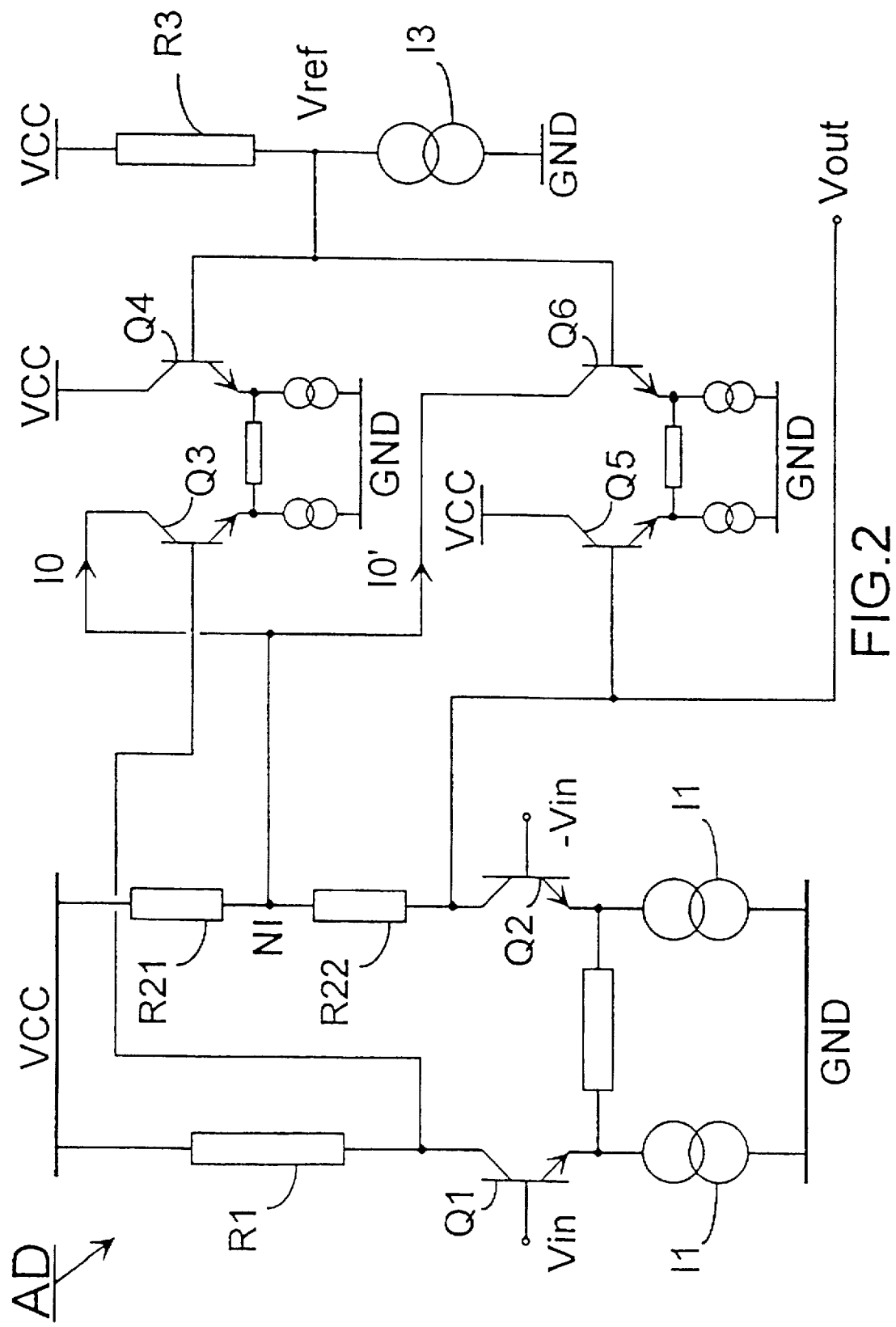
FIG. 2 is a partial functional circuit diagram of a voltage amplifier in accordance with an advantageous embodiment of the invention.

FIG. 2 shows diagrammatically a voltage amplifier AD in accordance with an advantageous embodiment of the invention. The structures of the amplifier stage and the branches comprising the resistive loads are identical to those described with reference to FIG. 1. An embodiment of means 10 and 11 is also shown: these means respectively comprise a third transistor Q3 and a fourth transistor Q4 arranged as a differential pair, and a fifth transistor Q5 and a sixth transistor Q6 arranged as a differential pair. The base of the third transistor Q3 is connected to the collector of the first transistor Q1 and that of the fourth transistor Q4 is connected to the second intermediate node, the base of the fifth transistor Q5 is connected to the collector of the second transistor Q2 and that of the sixth transistor Q6 is connected to the second intermediate node. The collectors of the third and the sixth transistor Q3 and Q6 are connected to the first intermediate node NI and those of the fourth and the fifth transistor Q4 and Q5 are connected to the positive power supply terminal VCC.

In this embodiment, the resistive element R21 and the resistive element R3 comprised in the third branch have substantially the same value, and the current supplied by the current source I3 has a value substantially equal to the maximum value of the current flowing in the second transistor Q2, which is of the order of 2.I1. Moreover, the resistive element R21 has a value which is lower than that of the resistive element R22. R21 is chosen to be lower than R22/10 so that the voltage drop at the terminals of R21 only has a corrective effect on the output voltage Vout. For reasons of symmetry of operation of the amplifier, the value of the resistive load of the first branch R1 is equal to the sum of the values of the resistive elements R21 and R22 constituting the resistive load of the second branch.

For better comprehension of the operation of amplifier AD, FIGS. 3 to 7 show the evolution of various signals within this amplifier, as a function of its input voltage.

Figure 3:
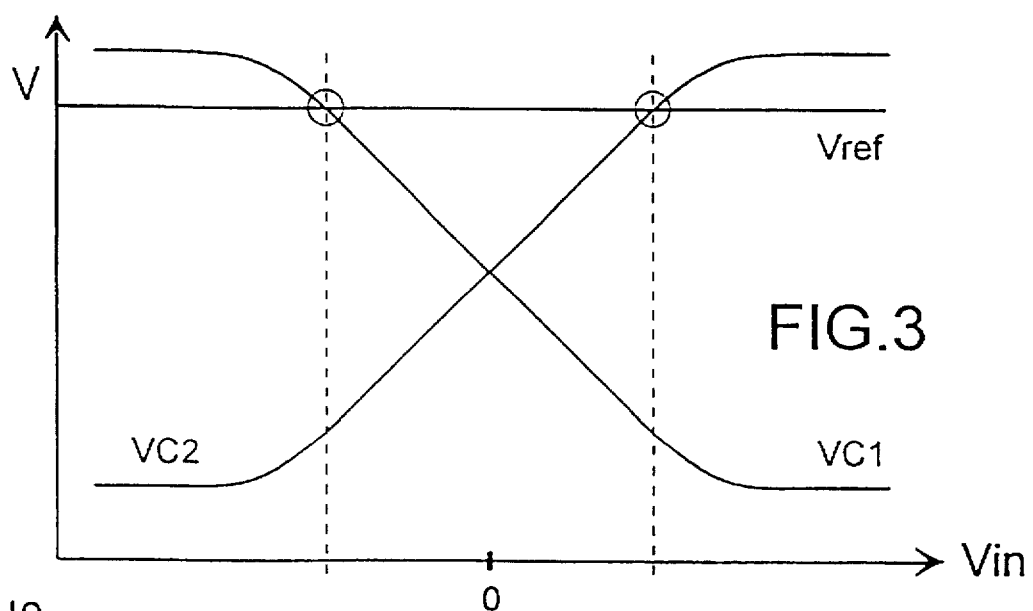
FIG. 3 is a set of characteristic curves describing the evolution of the potentials of the collectors of the first and second transistors, as a function of the input voltage of the amplifier.
Figure 4:
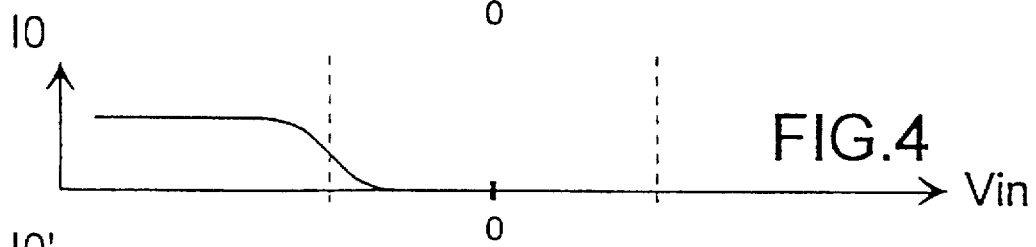
FIG. 4 is a characteristic curve describing the evolution of the first current added in a portion of the resistive load, as a function of the input voltage of the amplifier.
Figure 5:
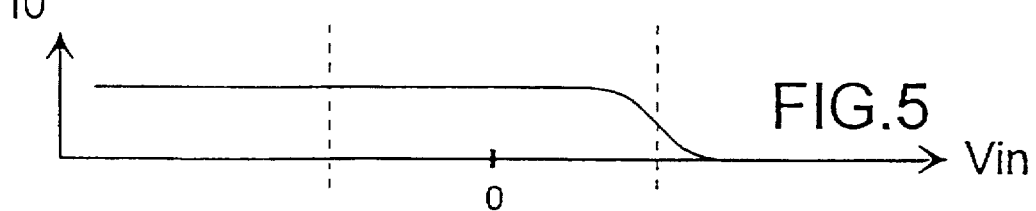
FIG. 5 is a characteristic curve describing the evolution of the second current added in a portion of the resistive load, as a function of the input voltage of the amplifier.
Figure 6:
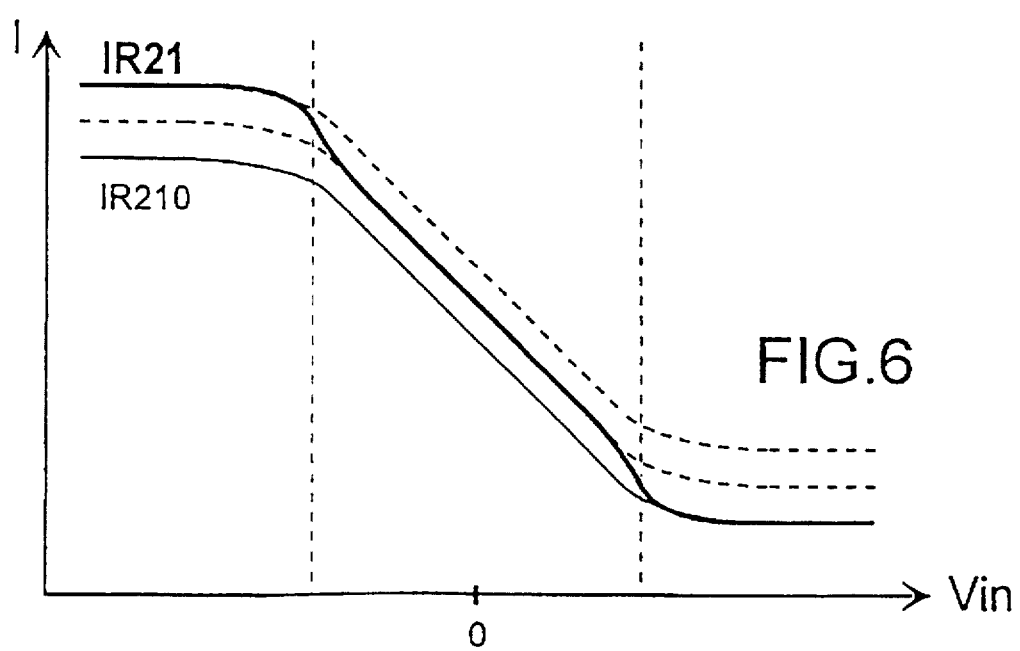
FIG. 6 is a set of characteristic curves describing the evolution of the current in said portion of the resistive load, as a function of the input voltage of the amplifier.
Figure 7:
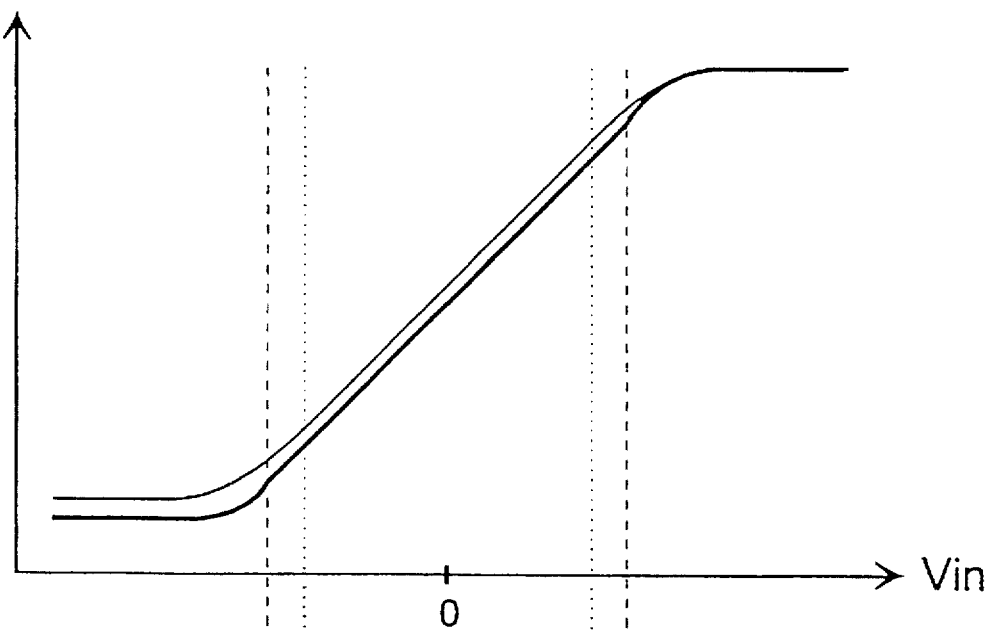
FIG. 7 is a characteristic curve describing the evolution of the output voltage, as a function of the input voltage of the amplifier.

FIG. 3 shows the evolution of the potentials VC1 and VC2, as a function of the input voltage Vin of the amplifier AD. FIGS. 4 and 5 show the evolution of the first and second currents IO and IO', respectively, added in a portion of the resistive load, in this case R21, as a function of the input voltage Vin of the amplifier AD. FIG. 6 shows the evolution of the total current in said portion of the resistive load R21 as a function of the input voltage Vin of the amplifier AD. The curve IR210 illustrates the current which would flow in the second branch if the means 10 and 11 did not exist, i.e. in the case of a conventional differential pair. The broken-line curves illustrate the currents which would flow in the portion of the resistive load R21 if, in a first case, the maximum value of the current IO were added to the current IR210 and if, in a second case, the maximum value of the current IO' were added to the current previously obtained. FIG. 7 illustrates by way of the fat solid line the evolution of the output voltage Vout as a function of the input voltage Vin of an amplifier according to the invention, while the thin solid line illustrates the evolution of the output voltage of a conventional differential pair.

When Vin is negative and large in absolute value, the transistor Q1 is hardly turned on, whereas the transistor Q2 is fully turned on. The current in the first branch is thus very low, whereas the current in the second branch is considerable. The voltage drop in the resistive element R1 is negligible, whereas the voltage drops in the resistive elements R21 and R22 are significant. FIG. 3 shows that VC1 is then substantially larger than Vref. The transistor Q4 is thus hardly turned on, whereas the transistor Q3 is fully turned on and causes a current IO to flow through resistor R21. As Vref is substantially larger than VC2, the transistor Q5 is hardly turned on, whereas the transistor Q6 is fully turned on and causes an additional current IO to flow through the resistor R21. The total current IR21 flowing through resistor R21 is illustrated in FIG. 6. As the current flowing in the second branch has its maximum level, the output voltage Vout is at its lowest level, as is shown in FIG. 7, and the additional voltage drop generated in R21 by the added currents IO and IO' explains the difference of value between the low level of the output voltage Vout of an amplifier according to the invention and that of the output voltage of the conventional differential pair.

When Vin increases, while staying negative, the first zone of non-linear operation of the conventional amplifier stage is reached: transistor Q1 conducts to a larger extent whereas transistor Q2 conducts to a smaller extent, while the current flowing in the first branch increases and the current flowing in the second branch decreases. The potentials VC1 and Vref approach each other, thus increasing the conduction of Q4 and decreasing the conduction of Q3, and causing the progressive elimination of the current IO flowing through resistor R21.

All along the linear portion, which corresponds to the change of sign of Vin, transistor Q5 remains slightly conducting, whereas transistor Q6 remains very conducting and maintains the flow of the current IO' through resistor R21.

When Vin increases, the second zone of non-linear operation of the conventional amplifier stage is reached: transistor Q1 then conducts even more, whereas the transistor Q2 conducts even less and the current flowing in the first branch increases, whereas the current flowing in the second branch decreases. The potentials VC2 and Vref approach each other, thus increasing the conduction of Q5 and decreasing the conduction of Q6, and causing the progressive elimination of the current IO' flowing through the resistor R21.

When Vin has a large value, the transistor Q2 conducts to a very small extent whereas the transistor Q1 conducts to a very large extent. The current in the second branch is thus very low, whereas the current in the first branch is considerable. The voltage drop in the resistive element R1 is significant, whereas the voltage drops in the resistive elements R21 and R22 are negligible. The output voltage Vout is then at its highest level, as is shown in FIG. 7.

This figure shows the influence of the additional pairs of transistors in the non-linear zones of the characteristic curve of output voltage Vout. In the first non-linear zone, where Vout increases too early with Vin in the case of the conventional differential pair, the addition of the currents IO and IO' artificially maintains Vout at the low level for a longer time and subsequently the progressive decrease of IO allows Vout to increase quasi-linearly. Similarly, in the second non-linear zone, where Vout increases too slowly with Vin in the case of the conventional differential pair, the addition of the current IO' artificially maintains Vout at an intermediate level for a longer time and subsequently the progressive decrease of IO' allows Vout to increase quasi-linearly.

Figure 8:
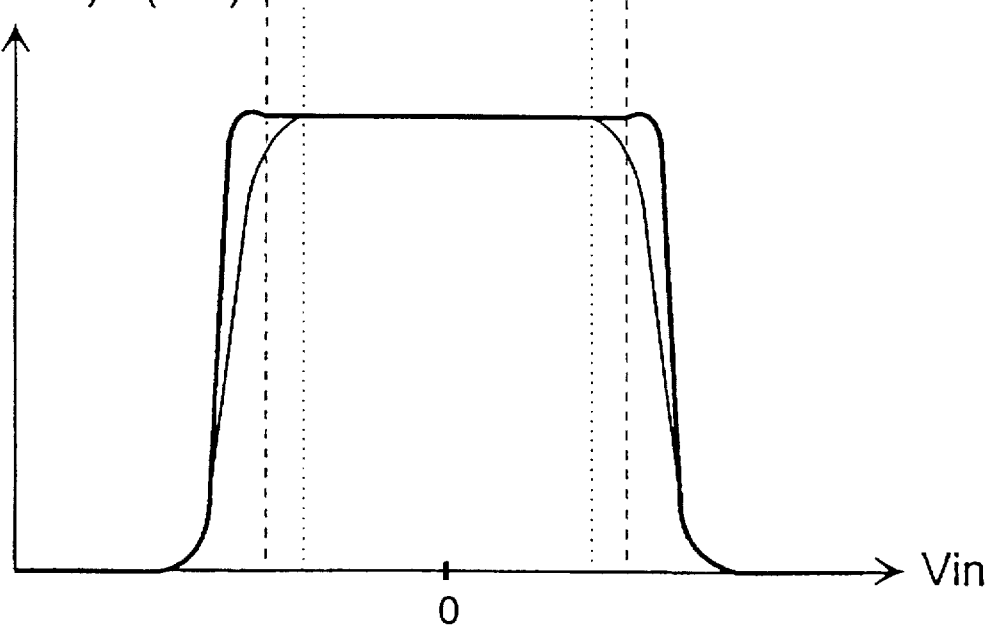
FIG. 8 is a characteristic curve describing the evolution of the derivative of the output voltage, as a function of the derivative of the input voltage of the amplifier.

In this way, the zone where the output voltage evolves linearly as a function of the input voltage is enlarged. This result can be seen in FIG. 8, which shows two characteristic curves d(Vin)/d(Vout), as a function of the input voltage Vin, the thin solid-line curve corresponding to a conventional differential pair and the fat solid-line curve corresponding to an amplifier according to the invention. The "flat" part, where the derivative of the output voltage Vout with respect to the input voltage Vin is constant, corresponds to the part where the output voltage evolves linearly as a function of the input voltage. The zone thus defined is clearly larger for a voltage amplifier according to the invention than for a conventional differential pair.

Figure 9:
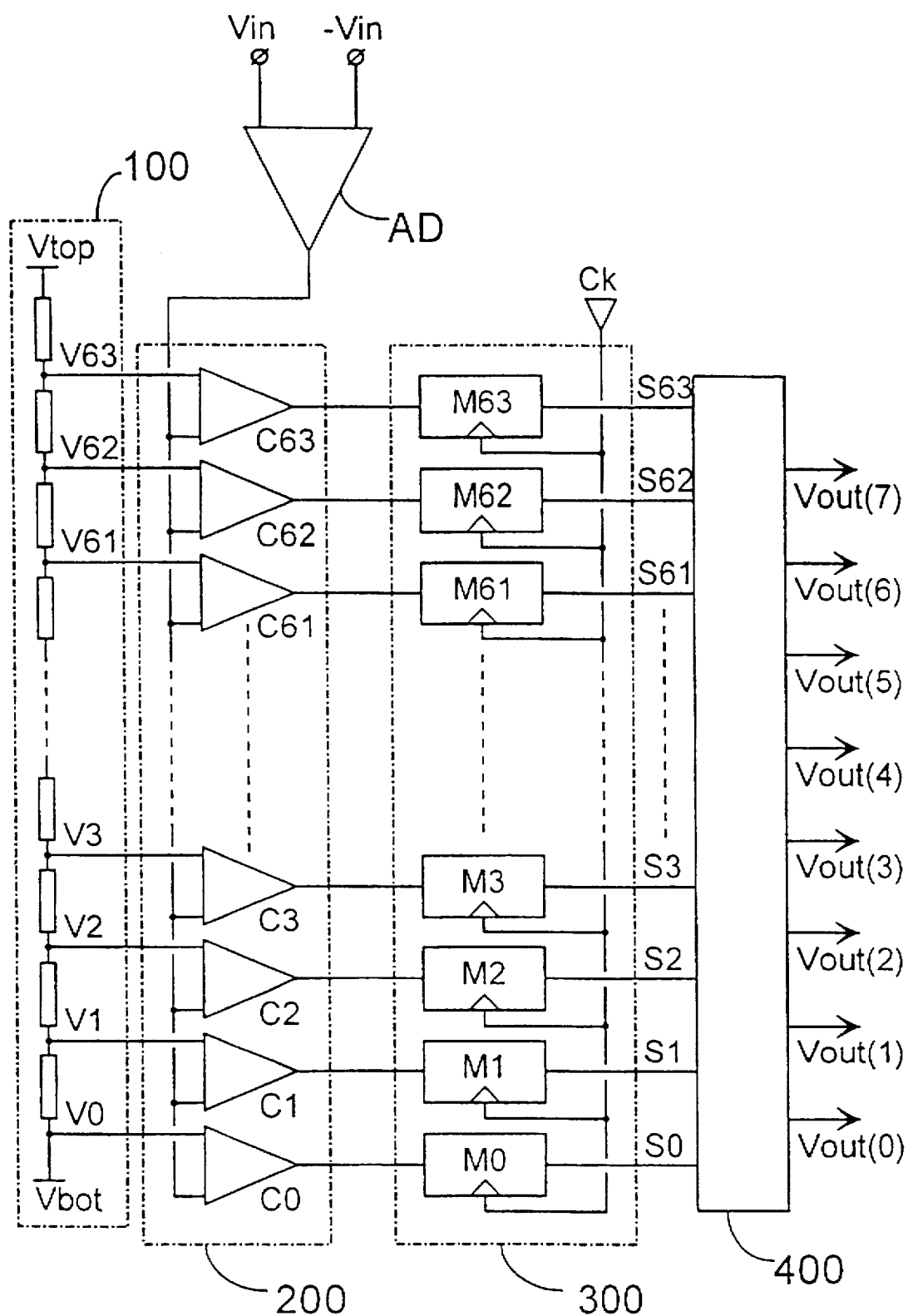
FIG. 9 is a partial functional circuit diagram of an A/D converter comprising a voltage amplifier according to the invention.

FIG. 9 shows partly an A/D converter which comprises a voltage amplifier AD in accordance with one of the variants shown in FIGS. 1 and 2. In the present case, this converter receives an analog input voltage of a differential nature (Vin, −Vin) to be converted into an 8-bit digital output signal Vout(0 ... 7). This converter comprises:

the input amplifier AD receiving the analog input voltage (Vin, −Vin), and supplying an analog output voltage a resistance ladder 100 consisting of 64 resistors arranged in series between a positive and a negative power supply terminal Vtop and Vbot, respectively, which resistors supply 64 reference voltages V0, V1, V63, V0 being equal to Vbot, at their intermediate nodes, a comparator stage 200 consisting of 64 comparators each performing a comparison between the output voltage of the input amplifier AD and one of the reference voltages V0, V1, ..., V63, a memory stage 300 consisting of storage elements referred to as memory cells M0, M1, ... M63, each memory cell Mi (for i=0 to 63) having a data input, an output and a clock input and receiving, at its data input, an output signal Ci from a comparator, all the memory cells M0, M1, ... M63 constituting the memory stage 300 and receiving, at their clock inputs, a same signal Ck referred to as clock signal, and a binary encoder 400 having an input which receives the output signals S0, S1, ... S63 from the memory stage 300 and supplies the digital output signal Vout(0 ... 7) of the converter.

What is claimed is:

1. A voltage amplifier receiving an input voltage and supplying an output voltage, which voltage amplifier comprises an amplifier stage including a first and a second transistor arranged as a differential pair, the base of the first transistor receiving the input voltage, the base of the second transistor receiving a voltage opposed to said input voltage, the collector of the first transistor being connected to a positive power supply terminal by means of a first branch comprising a resistive load, the collector of the second transistor supplying the output voltage being connected to the same positive power supply terminal by means of a second branch comprising a resistive load, characterized in that the second branch is constituted by at least two series-arranged resistive elements having at least a first intermediate node between the positive power supply terminal and the collector of the second transistor, in that said voltage amplifier is provided with a third branch comprising a resistive element arranged in series with a current source, said third branch being arranged between the positive power supply terminal and a negative power supply terminal and featuring a second intermediate node between the resistive element and the current source, and in that the voltage amplifier is provided with means for comparing the potential of the second intermediate node with that of the collector of the first transistor, on the one hand, and the potential of the second intermediate node with that of the collector of the second transistor, on the other hand, and for adding to the current supplied in a portion of the resistive load of the second branch, a first current which is progressively reduced to zero when the potential of the collector of the first transistor falls below that of the second intermediate node, and a second current which is progressively reduced to zero when the potential of the collector of the second transistor exceeds that of the second intermediate node.

2. A voltage amplifier as claimed in claim 1, characterized in that the means for comparing the potential of the second intermediate node with that of the collector of the first transistor, on the one hand, and the potential of the second intermediate node with that of the collector of the second transistor, on the other hand, respectively comprise a third and a fourth transistor arranged as a differential pair, and a fifth and a sixth transistor, arranged as a differential pair, the base of the third transistor being connected to the collector of the first transistor and that of the fourth transistor being connected to the second intermediate node, the base of the fifth transistor being connected to the collector of the second transistor and that of the sixth transistor being connected to the second intermediate node, and the collectors of the third and the sixth transistor being connected to the first intermediate node.

3. A voltage amplifier as claimed in claim 2, characterized in that the resistive element between the positive power supply terminal and the first intermediate node and the resistive element comprised in the third branch have substantially the same value, and in that the current supplied by the current source comprised in the third branch has a value substantially equal to the maximum value of the current flowing in the second transistor.

4. A voltage amplifier as claimed in claim 3, characterized in that the resistive element between the first intermediate node and the positive power supply terminal has a value which is lower than that of the resistive element between the first intermediate node and the collector of the second transistor.

5. A voltage amplifier as claimed in claim 4, characterized in that the value of the resistive load of the first branch is equal to the sum of the values of the resistive elements constituting the resistive load of the second branch.

6. A voltage amplifier as claimed in claim 5, characterized in that the resistive elements constituting the load of the amplifier stage are resistors.

7. An A/D converter intended to receive an analog input voltage of a differential nature, to be converted into a digital output signal, comprising:

an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages, a memory stage intended to store the results of said comparisons, and a binary encoder intended to receive the information stored in the memory stage and to supply the digital output signal of the converter, characterized in that the input amplifier is an amplifier as claimed in claim 5.

8. An A/D converter intended to receive an analog input voltage of a differential nature, to be converted into a digital output signal, comprising:

an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages, a memory stage intended to store the results of said comparisons, and a binary encoder intended to receive the information stored in the memory stage and to supply the digital output signal of the converter, characterized in that the input amplifier is an amplifier as claimed in claim 4.

9. A voltage amplifier as claimed in claim 3, characterized in that the value of the resistive load of the first branch is equal to the sum of the values of the resistive elements constituting the resistive load of the second branch.

10. An A/D converter intended to receive an analog input voltage of a differential nature, to be converted into a digital output signal, comprising:

an input amplifier intended to receive the analog input voltage, and to supply an analog output voltage, a resistance ladder arranged-in series between a positive and a negative power supply terminal, in which the resistors are intended to supply a plurality of reference voltages at their intermediate nodes, a comparator stage in which each-comparator is intended to perform a comparison between the output voltage of the input amplifier and one of the reference voltages, a memory stage intended to store the results of said comparisons, and a binary encoder intended to receive the information stored in the memory stage and to supply the digital output signal of the converter, characterized in that the input amplifier is an amplifier as claimed in claim 9.

11. An A/D converter intended to receive an analog input voltage of a differential nature, to be converted into a digital output signal, comprising:

an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between compare the output voltage of the input amplifier and one of the reference voltages, a memory stage intended to store the results of said comparisons, and a binary encoder intended to receive the information stored in the memory stage and to supply the digital output signal of the converter, characterized in that the input amplifier is an amplifier as claimed in claim 3.

12. A voltage amplifier as claimed in claim 2, characterized in that the resistive element between the first intermediate node and the positive power supply terminal has a value which is lower than that of the resistive element between the first intermediate node and the collector of the second transistor.

13. An A/D converter intended to receive an analog input voltage of a differential nature, to be converted into a digital output signal, comprising:

an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages, a memory stage intended to store the results of said comparisons, and a binary encoder intended to receive the information stored in the memory stage and to supply the digital output signal of the converter, characterized in that the input amplifier is an amplifier as claimed in claim 12.

14. A voltage amplifier as claimed in claim 2, characterized in that the value of the resistive load of the first branch is equal to the sum of the values of the resistive elements constituting the resistive load of the second branch.

15. An A/D converter intended to receive an analog input voltage of a differential nature, to be converted into a digital output signal, comprising:

an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages, a memory stage intended to store the results of said comparisons, and a binary encoder intended to receive the information stored in the memory stage and to supply the digital output signal of the converter, characterized in that the input amplifier is an amplifier as claimed in claim 2.

16. An A/D converter intended to receive an analog input voltage of a differential nature, to be converted into a digital output signal, comprising:

an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages, a memory stage intended to store the results of said comparisons, and a binary encoder intended to receive the information stored in the memory stage and to supply the digital output signal of the converter, characterized in that the input amplifier is an amplifier as claimed in claim 1.

17. A voltage amplifier as claimed in claim 1, characterized in that the resistive element between the positive power supply I terminal and the first intermediate node and the resistive element comprised in the third branch have substantially the same value, and in that the current supplied by the current source comprised in the third branch has a value substantially equal to the maximum value of the current flowing in the second transistor.

18. An A/D converter intended to receive an analog input voltage of a differential nature, to be converted into a digital output signal, comprising:

an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages, a memory stage intended to store the results of said comparisons, and a binary encoder intended to receive the information stored in the memory stage and to supply the digital output signal of the converter, characterized in that the input amplifier is an amplifier as claimed in claim 17.

19. A voltage amplifier as claimed in claim 1, characterized in that the resistive element between the first intermediate node and the positive power supply terminal has a value which is lower than that of the resistive element between the first intermediate node and the collector of the second transistor.

20. A voltage amplifier as claimed in claim 1, characterized in that the value of the resistive load of the first branch is equal to the sum of the values of the resistive elements constituting the resistive load of the second branch.

* * * * *